US012650641B2

(12) United States Patent
Park et al.

(10) Patent No.: US 12,650,641 B2
(45) Date of Patent: Jun. 9, 2026

(54) PHOTOSENSITIVE RESIN COMPOSITION, PHOTOSENSITIVE RESIN LAYER USING THE SAME AND COLOR FILTER

(71) Applicant: SAMSUNG SDI CO., LTD., Yongin-si (KR)

(72) Inventors: Baek Soung Park, Suwon-si (KR); Jihye Kim, Suwon-si (KR); Sabina Kim, Suwon-si (KR); Jihong Kim, Suwon-si (KR); Haeni Song, Suwon-si (KR); Jeongho Yoo, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 761 days.

(21) Appl. No.: 18/078,359

(22) Filed: Dec. 9, 2022

(65) Prior Publication Data

US 2023/0185190 A1    Jun. 15, 2023

(30) Foreign Application Priority Data

| Dec. 10, 2021 | (KR) | 10-2021-0176932 |
| Sep. 19, 2022 | (KR) | 10-2022-0118061 |

(51) Int. Cl.
*G03F 7/00* (2006.01)
*G03F 7/033* (2006.01)

(52) U.S. Cl.
CPC ............ *G03F 7/0007* (2013.01); *G03F 7/033* (2013.01)

(58) Field of Classification Search
None
See application file for complete search history.

(56) References Cited

U.S. PATENT DOCUMENTS

2022/0244637 A1    8/2022   Kawashima et al.

FOREIGN PATENT DOCUMENTS

| JP | 11-24245 A | 1/1999 |
| JP | 2007-072357 A | 3/2007 |
| JP | 2007-114723 A | 5/2007 |
| JP | 2007-256407 A | 10/2007 |
| JP | 2008-310009 A | 12/2008 |
| JP | 4739720 B2 | 8/2011 |
| JP | 2011-221310 A | 11/2011 |
| JP | 2013-177509 A | 9/2013 |
| JP | 2017016132 A | * | 1/2017 |
| JP | 6286834 B2 | 3/2018 |
| JP | 2020-012115 A | 1/2020 |
| JP | 2021-105711 | 7/2021 |
| KR | 10-2007-0036817 A | 4/2007 |
| KR | 10-2007-0076435 A | 7/2007 |
| KR | 10-1390709 B1 | 4/2014 |
| KR | 20140118196 A | * | 10/2014 | ............. G03F 7/004 |
| KR | 10-2015-0113863 A | 10/2015 |
| KR | 10-2017-0120343 A | 10/2017 |
| KR | 20180033816 A | * | 4/2018 | ............. H01L 51/50 |
| KR | 10-2019-0063843 A | 6/2019 |
| KR | 20190093116 A | * | 8/2019 | ........... G03F 7/0048 |
| KR | 10-2021-0083185 A | 7/2021 |
| TW | 200731006 A | 8/2007 |
| TW | 200804975 A | 1/2008 |
| WO | WO 2021-075393 A1 | 4/2021 |

OTHER PUBLICATIONS

Machine translation of KR 2014-0118196 (no date) (Year: 0000).*
Machine translation of KR 2019-0093116 (no date) (Year: 0000).*
Japanese Office action, dated Dec. 11, 2024.
Japanese Writen Opposition dated Sep. 27, 2024.
Third Party Observation received in Korean Application dated Mar. 24, 2025.
Japanese Office action, Opposition dated Dec. 11, 2024.
Japanese Office action, Opposition dated Sep. 27, 2024.
Taiwanese Office Action (including a search report) dated Oct. 30, 2023, of the corresponding Taiwanese Patent Application No. 111147550.

* cited by examiner

*Primary Examiner* — Amanda C. Walke
(74) *Attorney, Agent, or Firm* — Lee IP Law, P.C.

(57) ABSTRACT

A photosensitive resin composition, a photosensitive resin layer, a color filter, and a display device, the photosensitive resin composition includes a photopolymerizable compound; a photopolymerization initiator; a colorant; a binder resin; and a solvent, wherein the solvent includes a first solvent and a second solvent, the first solvent has a boiling point of greater than about 0° C. and less than about 150° C. at 1 atm, the second solvent has a boiling point of greater than or equal to about 150° C. at 1 atm, and the first solvent is included in the photosensitive resin composition in an amount greater than that of the second solvent.

17 Claims, No Drawings

PHOTOSENSITIVE RESIN COMPOSITION, PHOTOSENSITIVE RESIN LAYER USING THE SAME AND COLOR FILTER

CROSS-REFERENCE TO RELATED APPLICATION

This application claims priority to and the benefit of Korean Patent Application No. 10-2021-0176932 filed in the Korean Intellectual Property Office on Dec. 10, 2021, and Korean Patent Application No. 10-2022-0118061 filed in the Korean Intellectual Property Office on Sep. 19, 2022, the entire contents of which are incorporated herein by reference.

BACKGROUND

1. Field

Embodiments relate to a photosensitive resin composition, and a photosensitive resin layer and a color filter using the same.

2. Description of the Related Art

An image sensor is a semiconductor that converts photons into electrons and displays them on a display device or stores them in a storage device.

The image sensor is classified into a charge coupled device (CCD) image sensor and a complementary metal-oxide semiconductor (CMOS) image sensor according to a manufacturing process and an application method.

Specifically, the image sensor includes a color filter including filter segments of additive and mixed primary colors of red, green, and blue. External light passing through the color filter is converted into color image data (R, G, B data) and then, processed into signals, through which a display device is driven.

The color filter may be manufactured by coating a photosensitive resin composition containing a colorant on a substrate, exposing a pattern with a desired shape, developing it, and thermally curing it through baking to form a photosensitive resin layer and then, repeating this series of processes.

SUMMARY

The embodiments may be realized by providing a photosensitive resin composition including a photopolymerizable compound; a photopolymerization initiator; a colorant; a binder resin; and a solvent, wherein the solvent includes a first solvent and a second solvent, the first solvent has a boiling point of greater than about 0° C. and less than about 150° C. at 1 atm, the second solvent has a boiling point of greater than or equal to about 150° C. at 1 atm, and the first solvent is included in the photosensitive resin composition in an amount greater than that of the second solvent.

The first solvent may have a boiling point of greater than or equal to about 90° C. and less than about 150° C. at 1 atm.

The first solvent may have a boiling point of greater than or equal to about 110° C. and less than about 150° C. at 1 atm.

The first solvent may include propylene glycol monomethyl ether acetate, n-butanol, cyclobutanone, cyclopentanone, or a combination thereof.

The second solvent may have a boiling point of greater than or equal to about 150° C. and less than or equal to about 350° C. at 1 atm.

The second solvent may have a boiling point of greater than or equal to about 160° C. and less than or equal to about 290° C. at 1 atm.

The second solvent includes a cyclic solvent may include a ketone (*—(C=O)—*) functional group, a linear solvent containing an ether (*—O—*) functional group, or a combination thereof.

The second solvent may include cyclohexanone, cycloheptanone, N-cyclohexyl-2-pyrrolidone, diethylene glycol methyl ethyl ether (MEDG), or a combination thereof.

The solvent may include the first solvent and the second solvent in a weight ratio of about 2:1 to about 7:1.

The first solvent may be included in the photosensitive resin composition in an amount of about 30 wt % to about 60 wt %, based on a total weight of the photosensitive resin composition.

The second solvent may be included in the photosensitive resin composition in an amount of about 1 wt % to about 20 wt %, based on a total weight of the photosensitive resin composition.

The colorant may include a pigment.

The pigment may include a blue pigment, a purple pigment, or a mixture thereof.

The photosensitive resin composition may include about 0.1 wt % to about 20 wt % of the photopolymerizable compound; about 0.1 wt % to about 5 wt % of the photopolymerization initiator; about 5 wt % to about 50 wt % of the colorant; and about 0.1 wt % to about 20 wt % of the binder resin, all wt % being based on a total weight of the photosensitive resin composition.

The photosensitive resin composition may further include malonic acid; 3-amino-1,2-propanediol; a coupling agent containing a vinyl group or a (meth)acryloxy group; a leveling agent; a fluorine surfactant; or a radical polymerization initiator.

The embodiments may be realized by providing a photosensitive resin layer manufactured using the photosensitive resin composition according to an embodiment.

The embodiments may be realized by providing a color filter comprising the photosensitive resin layer according to an embodiment.

The embodiments may be realized by providing a display device comprising the color filter according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. As used herein, the term "or" is not an exclusive term, e.g., "A or B" would include A, B, or A and B.

As used herein, when specific definition is not otherwise provided, "substituted" refers to replacement of at least one hydrogen of a compound by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

As used herein, when specific definition is not otherwise provided, "heterocycloalkyl group", "heterocycloalkenyl group", "heterocycloalkynyl group," and "heterocycloalkylene group" refer to presence of at least one N, O, S, or P in a cyclic compound of cycloalkyl, cycloalkenyl, cycloalkynyl, and cycloalkylene.

As used herein, when specific definition is not otherwise provided, "(meth)acrylate" refers to both "acrylate" and "methacrylate."

In the chemical formula of the present specification, unless a specific definition is otherwise provided, hydrogen is bonded at the position when a chemical bond is not drawn where supposed to be given.

(Photosensitive Resin Composition)

An embodiment may provide a photosensitive resin composition including, e.g., (A) a photopolymerizable compound; (B) a photopolymerization initiator; (C) a colorant; (D) a binder resin; and (E) a solvent. In an implementation, the solvent may include, e.g., a first solvent and a second solvent (e.g., different from the first solvent). In an implementation, the first solvent may have a boiling point of, e.g., greater than about 0° C. and less than about 150° C. under or at 1 atm. In an implementation, the second solvent may have a boiling point of, e.g., greater than or equal to about 150° C. at 1 atm. In an implementation, the first solvent may be included in an amount greater than that of the second solvent.

The photosensitive resin composition of the embodiment may include two solvents having different boiling points in a specific content ratio.

In an implementation, the first solvent may be a main solvent included in a larger amount than the second solvent, and may have a boiling point of less than about 150° C. (provided that greater than about 0° C.) at 1 atm, and the second solvent may be an auxiliary solvent included in a smaller amount than the first solvent and may have a boiling point of greater than or equal to about 150° C. at 1 atm.

In an implementation, the first solvent may be a solvent suitably used in a photosensitive resin composition. In an implementation, the second solvent may be a solvent having a boiling point of greater than or equal to about 150° C., and the boiling point of all solvents including the first solvent and the second solvent and the viscosity of the photosensitive resin composition including the same may be partially higher than the boiling point of the first solvent.

In an implementation, when a solvent including the first solvent as the main solvent and the second solvent as the auxiliary solvent is used, a viscosity of the photosensitive resin composition may be increased, compared to if the first solvent were to be used alone or if the first solvent and the second solvent were to be mixed but the second solvent is included in an amount greater than that of the first solvent.

In an implementation, when the solvent including the first solvent as the main solvent and the second solvent as the auxiliary solvent is used, even if the coating is performed at a high rotation speed, uniformity of the coating may be ensured without slanting defects. In an implementation, even if the color filter is manufactured in the form of a thin film, issues due to foreign matter may be minimized.

Hereinafter, each component included in the photosensitive resin composition will be described in detail.

(E) Solvent

First, the solvent will be described in more detail.

The first solvent may be a main solvent included in an amount greater than that of the second solvent and may have a boiling point of less than about 150° C. (provided that greater than about 0° C.), e.g., greater than or equal to about 90° C. and less than about 150° C., greater than or equal to about 100° C. and less than about 150° C., or greater than or equal to about 110° C. and less than about 150° C., at 1 atm.

The first solvent (having a boiling point within the above range) may include, e.g., propylene glycol monomethyl ether acetate (PGMEA), n-butyl alcohol (n-BA), cyclobutanone, cyclopentanone, or a combination thereof.

The propylene glycol monomethyl ether acetate may have a boiling point of 146.4° C. at 1 atm, the n-butyl alcohol may have a boiling point of 117.7° C. at 1 atm, the cyclobutanone may have a boiling point of 99.75° C. at 1 atm, and the cyclopentanone may have a boiling point of 131° C. at 1 atm.

The second solvent may be included in a smaller amount than the first solvent (auxiliary solvent) and may have a boiling point of greater than or equal to about 150° C., e.g., greater than or equal to about 150° C. and less than or equal to about 350° C., greater than or equal to about 150° C. and less than or equal to about 300° C., or greater than or equal to about 160° C. and less than or equal to about 290° C., at 1 atm.

In an implementation, the second solvent (having a boiling point within the above range) may include, e.g., a cyclic solvent including a ketone (*—(C═O)—*) functional group, a linear solvent containing an ether (*—O—*) functional group, or a combination thereof. In an implementation, solubility in a material having a polar group among the solid content of the photosensitive resin composition (i.e., (A) photopolymerizable compound; (B) photopolymerization initiator; (C) colorant; and (D) binder resin) may be high. Accordingly, it is possible to further increase coating uniformity during the manufacturing process of the color filter.

In an implementation, the cyclic solvent having a boiling point within the above range and including a ketone (*—(C═O)—*) functional group may include, e.g., cyclohexanone, cycloheptanone, or N-cyclohexyl-2-pyrrolidone. In an implementation, the linear solvent having a boiling point within the above range and including an ether (*—O—*) functional group may include, e.g., diethylene glycol methyl ethyl ether (MEDG).

The cyclohexanone may have a boiling point of 155.6° C. at 1 atm, the cycloheptanone may have a boiling point of 179° C. at 1 atm, the N-cyclohexyl-2-pyrrolidone may have a boiling point of 284° C. at 1 atm, and diethylene glycol methyl ethyl ether may have a boiling point of 176° C. at 1 atm.

In an implementation, the solvent may include the first solvent and the second solvent in a weight ratio of, e.g., about 2:1 to about 7:1, about 3:1 to about 6:1, or about 4:1 to about 5:1. Within these ranges, the boiling points of all solvents including the first solvent and the second solvent and the viscosity of the photosensitive resin composition including the same may be adjusted in an appropriate range, and even if the coating is performed at a high rotation speed, coating uniformity without slanting defects. In an implementation, even when the color filter is manufactured in the form of a thin film, issues caused by foreign matter may be minimized.

In an implementation, the first solvent may be included in the composition in an amount of, e.g., about 30 wt % to about 60 wt %, or about 35 wt % to about 50 wt %, based on a total weight of the composition. In an implementation, the second solvent may be included in the composition in an amount of, e.g., about 1 wt % to about 20 wt %, or about 8 wt % to about 10 wt %, based on the total weight of the photosensitive resin composition. In an implementation, the aforementioned weight ratio ranges may still be satisfied while satisfying the content ranges of each solvent.

In an implementation, the solvent may further include a third solvent that has compatibility with the colorant, the binder resin, the photopolymerizable compound, and the photopolymerization initiator but does not react with them, in addition to the first solvent and the second solvent.

Examples of the third solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol dimethyl ether (EDM), ethylene glycol monomethylether, ethylene glycol monoethylether, and the like; cellosolve acetates such as methyl cellosolve acetate, ethyl cellosolve acetate, diethyl cellosolve acetate, and the like; ethyl lactate (EL), ethylene glycol ethyl acetate (EGA), cyclohexanone, 3-methoxy-1-butanol, methylene glycol ethyl acetate, ethylene glycol methyl acetate, butyl lactate, methyl lactate, cyclopentanone, cyclobutanone, cycloheptanone, carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethyl ether acetate, propylene glycol propyl ether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic alkyl monocarboxylate esters such as ethyl acetate, n-butyl acetate, isobutyl acetate, and the like; lactate esters such as methyl lactate, ethyl lactate, and the like; oxy alkyl acetate esters such as oxy methyl acetate, oxy ethyl acetate, oxy butyl acetate, and the like; alkoxy alkyl acetate esters such as methoxy methyl acetate, methoxy ethyl acetate, methoxy butyl acetate, ethoxy methyl acetate, ethoxy ethyl acetate, and the like; 3-oxy alkyl propionate esters such as 3-oxy methyl propionate, 3-oxy ethyl propionate, and the like; 3-alkoxy alkyl propionate esters such as 3-methoxy methyl propionate, 3-methoxy ethyl propionate, 3-ethoxy ethyl propionate, 3-ethoxy methyl propionate, and the like; 2-oxy alkyl propionate esters such as 2-oxy methyl propionate, 2-oxy ethyl propionate, 2-oxy propyl propionate, and the like; 2-alkoxy alkyl propionate esters such as 2-methoxy methyl propionate, 2-methoxy ethyl propionate, 2-ethoxy ethyl propionate, 2-ethoxy methyl propionate, and the like; 2-oxy-2-methyl propionate esters such as 2-oxy-2-methyl methyl propionate, 2-oxy-2-methyl ethyl propionate, and the like, monooxy alkyl monocarboxylate esters of 2-alkoxy-2- methyl alkyl propionate such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, may be additionally a solvent having a high boiling point such as N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like.

In an implementation, considering compatibility and reactivity, the solvent may include, e.g., ketones such as cyclohexanone, or the like; glycol ethers such as ethylene glycol monoethylether, or the like; ethylene glycol alkylether acetates such as ethyl cellosolve acetate, or the like; esters such as 2-hydroxy ethyl propionate, or the like; carbitols such as diethylene glycol monomethylether, or the like; propylene glycol alkylether acetates such as propylene glycol monomethylether acetate, propylene glycol propylether acetate, or the like, ketones such as cyclohexanone, or the like.

In an implementation, the solvent may be included in a balance amount, e.g., about 5 wt % to about 70 wt %, or about 10 wt % to about 50 wt %, based on the total weight of the photosensitive resin composition. When the solvent is included within the above ranges, a coating film having excellent coating property of the photosensitive resin composition and excellent flatness may be obtained.

(A) Photopolymerizable Compound

The photopolymerizable compound may include, e.g., a mono-functional or multi-functional ester of (meth)acrylic acid including at least one ethylenic unsaturated double bond.

The photopolymerizable compound may have the ethylenic unsaturated double bond and thus, may cause sufficient polymerization during exposure in a pattern-forming process and may form a pattern having excellent heat resistance, light resistance, and chemical resistance.

Examples of the photopolymerizable compound may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta(meth) acrylate, dipentaerythritol hexa(meth)acrylate, bisphenol A epoxy(meth)acrylate, ethylene glycol monomethylether (meth)acrylate, trimethylol propane tri(meth)acrylate, tris (meth)acryloyloxyethyl phosphate, novolac epoxy (meth) acrylate, and the like.

Commercially available examples of the photopolymerizable compound may be as follows. The mono-functional (meth)acrylic acid ester may include Aronix M101®, M-111®, M-114® of Toagosei Chemistry Industry Co., Ltd.; KAYARAD TC-110S®, TC-120S® of Nippon Kayaku Co., Ltd.; V-158®, V-2311 of Osaka Organic Chemical Ind., Ltd., and the like. Examples of a difunctional (meth)acrylic acid ester may include Aronix M-210®, M-240®, M-6200® of Toagosei Chemistry Industry Co., Ltd., KAYARAD HDDA®, HX-220®, R-604® of Nippon Kayaku Co., Ltd., V-260®, V–312°, V-335 HP® of Osaka Organic Chemical Ind., Ltd., and the like. Examples of a tri-functional (meth) acrylic acid ester may include Aronix M-309®, M-400®, M-405®, M-450°, M-710®, M-8030®, M-8060® of Toagosei Chemistry Industry Co., Ltd., KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V-400® of Osaka Yuki Kayaku Kogyo Co. Ltd., and the like. These may be used alone or as a mixture of two or more.

In an implementation, the photopolymerizable compound may be treated with acid anhydride to improve developability.

In an implementation, the photopolymerizable compound may be included in an amount of, e.g., about 0.1 wt % to about 20 wt %, about 1 wt % to about 15 wt %, or about 5 wt % to about 13 wt %, based on the total weight of the photosensitive resin composition. When the photopolymerizable compound is included within the above ranges, curing may sufficiently occur during exposure in the pattern forming process, thereby providing excellent reliability and excellent developability in an alkaline developer.

(B) Photopolymerization Initiator

The photopolymerization initiator may be an initiator suitably used in a photosensitive resin composition, e.g., an acetophenone compound, a benzophenone compound, a thioxanthone compound, a benzoin compound, a triazine compound, an oxime compound, or a combination thereof.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloroacetophenone, 2,2'-dichloro-4-phenoxy acetophenone, 2-methyl-1-(4-(methylthio)phenyl) morpholinopropan-1-one, 2-benzyl-2-dimethylamino-1-(4-morpholinophenyl)-butan one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include O-acyloxime-based compound, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, 0-ethoxycarbonyl-α-oxyamino-1-phenylpropan-1-one, and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, and 1-(4-phenylsulfanyl phenyl)-butan-1-oneoxime-O-acetate.

In an implementation, the photopolymerization initiator may include, e.g., a carbazole compound, a diketone compound, a sulfonium borate compound, a diazo compound, an imidazole compound, a biimidazole compound, a fluorene compound, or the like, beside the compounds above.

In an implementation, the photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

In an implementation, the photopolymerization initiator may be included in an amount of, e.g., about 0.1 wt % to about 5 wt %, about 0.5 wt % to about 4.5 wt %, or about 0.1 wt % to about 4 wt %, based on the total weight of the photosensitive resin composition. When the photopolymerization initiator is included within the ranges, sufficient photopolymerization may occur during exposure in a pattern-forming process, excellent reliability may be realized, heat resistance, light resistance, and chemical resistance of patterns, resolution and close-contacting properties may be improved, and decrease of transmittance due to a non-reaction initiator may be prevented.

(C) Colorant

In an implementation, the colorant may include, e.g., a pigment. In an implementation, the resin composition of the embodiment may be a pigment-type composition. The pigment may include, e.g., a green pigment, a blue pigment, a red pigment, a purple pigment, a yellow pigment, a black pigment, or the like.

In an implementation, the red pigment may include, e.g., C.I. red pigment 254, C.I. red pigment 255, C.I. red pigment 264, C.I. red pigment 270, C.I. red pigment 272, C.I. red pigment 177, C.I. red pigment 89, or the like in the color index, which may be used alone or in combination of two or more.

In an implementation, the purple pigment may include, e.g., C.I. violet pigment 23 V.23, C.I. violet pigment 29, dioxazine violet, first violet B, methyl violet lake, indanthrene brilliant violet, or the like in the color index, which may be used alone or in combination of two or more.

In an implementation, the green pigment may include, e.g., C.I. green pigment 7, C.I. green pigment 36, C.I. green pigment 58, C.I. green pigment 59, or the like in the color index, which may be used alone or in combination of two or more.

In an implementation, the blue pigment may include, e.g., a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 15:6, or C.I. blue pigment 16 in the color index, which may be used alone or in combination of two or more.

In an implementation, the yellow pigment may include, e.g., an isoindoline pigment such as C.I. yellow pigment 185, or C.I. yellow pigment 139, a quinophthalone pigment such as C.I. yellow pigment 138, or a nickel complex pigment such as C.I. yellow pigment 150 in the color index, which may be used alone or in combination of two or more.

In an implementation, the black pigment may include, e.g., aniline black, perylene black, titanium black, carbon black, or the like in the color index, which may be used alone or in combination of two or more.

In an implementation, the pigments may be used alone or in combination of two or more thereof. In an implementation, a blue pigment, a purple pigment, or a mixture thereof may be used as the pigment.

In an implementation, the pigment may be included in the photosensitive resin composition for a color filter in the form of a dispersion. Such a pigment dispersion may be composed of the pigment, a solvent, a dispersant, a dispersion resin, and the like. The solid pigment may be included in an amount of, e.g., about 5 wt % to about 20 wt %, or about 8 wt % to about 15 wt %, based on the total weight of the pigment dispersion.

The solvent may include, e.g., ethylene glycol acetate, ethyl cellosolve, propylene glycol methyl ether acetate, ethyl lactate, polyethylene glycol, cyclohexanone, propylene glycol methyl ether, or the like. In an implementation, the solvent may include, e.g., propylene glycol methyl ether acetate.

The dispersant may help the pigment to be uniformly dispersed in the dispersion, and nonionic, anionic or cationic dispersants may be used respectively. In an implementation, polyalkylene glycol or its ester, polyoxy alkylene, a polyhydric alcohol ester alkylene oxide adduct, an alcohol alkylene oxide adduct, sulfonic acid ester, sulfonic acid salt, carboxylic acid ester, carboxylic acid salt, alkyl amide alkylene oxide adduct, an alkylamine, or the like may be used, and these may be used alone or in combination of two or more.

As the dispersion resin, an acryl resin including a carboxyl group may be used, which may help improve the stability of the pigment dispersion as well as the patternability of the pixel.

In an implementation, the colorant may further include a dye while including the pigment, and in this case, the resin composition of the embodiment may be a hybrid composition. In an implementation, the dye may include, e.g., a metal complex dye.

The metal complex dye may use a compound having a maximum absorbance in a wavelength region of, e.g., about 200 nm to about 650 nm. In order to match the color coordinates with the combination of dyes, a suitable metal complex dye of any color that is soluble in an organic solvent may be used as long as it is a compound having an absorbance within the above range.

In an implementation, the metal complex dye may be, e.g., a green dye having a maximum absorbance in a wavelength region of about 530 nm to about 680 nm, a yellow dye having a maximum absorbance in a wavelength region of about 200 nm to about 400 nm, an orange dye having an orange dye having a maximum absorbance in a wavelength region of about 300 nm to about 500 nm, a red dye having a maximum absorbance in a wavelength region of about 500 nm to about 650 nm, or a combination thereof.

The metal complex dye may be a direct dye, an acid dye, a basic dye, an acid mordant dye, a sulfurized dye, a reduced dye, an azoic dye, a dispersion dye, a reactive dye, an oxidized dye, a useful dye, an anthraquinone dye, an indigoid dye, a carbonium ion dye, a phthalocyanine dye, a nitro dye, a quinoline dye, a cyanine dye, a polymethine dye, or a combination thereof.

The metal complex dye may include, e.g., Mg, Ni, Cu, Co, Zn, Cr, Pt, Pd, or Fe.

The metal complex dye may be a complex of, e.g., a C.I. solvent dye such as C.I. solvent green 1, 3, 4, 5, 7, 28, 29, 32, 33, 34, 35, or the like; C.I. acid dye such as C.I. acid green 1, 3, 5, 6, 7, 8, 9, 11, 13, 14, 15, 16, 22, 25, 27, 28, 41, 50, 50:1, 58, 63, 65, 80, 104, 105, 106, 109, or the like; C.I. direct dye such as C.I. direct green 25, 27, 31, 32, 34, 37, 63, 65, 66, 67, 68, 69, 72, 77, 79, 82, or the like, C.I. basic dye such as C.I. basic green 1, or the like; C.I. mordant dye such as C.I. mordant green 1, 3, 4, 5, 10, 13, 15, 19, 21, 23, 26, 29, 31, 33, 34, 35, 41, 43, 53, or the like, a green pigment such as C.I. pigment green 7, 36, 58, or the like; solvent yellow 19, solvent yellow 21, solvent yellow 25, solvent yellow 79, solvent yellow 82, solvent yellow 88, solvent orange 45, solvent orange 54, solvent orange 62, solvent orange 99, solvent red 8, solvent red 32, solvent red 109, solvent red 112, solvent red 119, solvent red 124, solvent red 160, solvent red 132, or solvent red 218, and the a metal ion.

The dye including the metal complex may have a solubility of, e.g., greater than or equal to about 5, or about 5 to about 10, in a solvent used in the photosensitive resin composition according to an embodiment. The solubility may be obtained by an amount (g) of the dye dissolved in 100 g of the solvent. When the solubility of the dye including the metal complex is within the above ranges, compatibility with other components constituting the photosensitive resin composition according to an embodiment and coloring power may be secured, and precipitation of the dye may be prevented.

The solvent may include, e.g., propylene glycol monomethyl ether acetate (PGMEA), ethyl lactate (EL), ethylene glycol ethyl acetate (EGA), cyclohexanone, 3-methoxy-1-butanol, or a combination thereof.

As it has the specific range, it may be usefully used in color filters such as LCDs and LEDs that express high luminance and high contrast ratio in desired color coordinates.

The dye including the metal complex may be included in an amount of, e.g., about 0.01 wt % to about 1 wt %, or about 0.01 wt % to about 0.5 wt %, based on the total weight of the photosensitive resin composition. When the dye including the metal complex is included in the above ranges, high luminance and contrast ratio may be expressed in a desired color coordinate.

When the dye and the pigment are mixed and used, they may be mixed in a weight ratio of about 0.1:99.9 to about 99.9:0.1, e.g., about 1:9 to about 9:1 by weight. When mixing in the above weight ratio ranges, chemical resistance and maximum absorption wavelength may be controlled in an appropriate range, and high luminance and contrast ratio may be expressed in a desired color coordinate.

The colorant may be included in an amount of, e.g., about 5 wt % to about 50 wt %, about 6 wt % to about 40 wt %, or about 7 wt % to about 30 wt %, based on the total weight of the photosensitive resin composition. When the colorant is included within the above range, the coloring effect and developability are excellent.

(D) Binder Resin

The binder resin may include, e.g., an acryl resin.

The acryl resin may be a copolymer of a first ethylenic unsaturated monomer and a second (e.g., different) ethylenic unsaturated monomer that is copolymerizable therewith, and may be a resin including at least one acrylic repeating unit.

The first ethylenic unsaturated monomer may be, e.g., an ethylenic unsaturated monomer including at least one carboxyl group. In an implementation, the first ethylenic unsaturated monomer may include, e.g., acrylic acid, methacrylic acid, maleic acid, itaconic acid, fumaric acid, a combination thereof.

The first ethylenic unsaturated monomer may be included in an amount of, e.g., about 5 wt % to about 50 wt %, or about 10 wt % to about 40 wt %, based on the total amount of the acryl binder resin.

In an implementation, the second ethylenic unsaturated monomer may include, e.g., an aromatic vinyl compound such as styrene, α-methylstyrene, vinyltoluene, vinylbenzylmethylether, or the like; an unsaturated carboxylic acid ester compound such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated carboxylic acid amino alkyl ester compound such as 2-aminoethyl(meth)acrylate, 2-dimethylaminoethyl (meth)acrylate, or the like; a carboxylic acid vinyl ester compound such as vinyl acetate, vinyl benzoate, or the like; an unsaturated carboxylic acid glycidyl ester compound such as glycidyl(meth)acrylate or the like; a vinyl cyanide compound such as (meth)acrylonitrile or the like; an unsaturated amide compound such as (meth)acrylamide or the like; or the like, and may be used alone or as a mixture of two or more.

In an implementation, the acryl resin may include, e.g., a (meth)acrylic acid/benzylmethacrylate copolymer, a (meth) acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, or the like, and these may be used alone or as a mixture of two or more.

In an implementation, the binder resin may include an epoxy binder resin.

In an implementation, the binder resin may further include the epoxy binder resin, thereby improving heat resistance. In an implementation, the epoxy binder resin may include, e.g., a phenol novolac epoxy resin, a tetramethyl biphenyl epoxy resin, a bisphenol A epoxy resin, a bisphenol F epoxy resin, an alicyclic epoxy resin, or a combination thereof.

In an implementation, the binder resin including the epoxy binder resin may help ensure dispersion stability of a colorant such as a pigment, which will be described below, and at the same time may help form a pixel having a desired resolution during the development process.

The epoxy binder resin may be included in an amount of, e.g., about 1 wt % to about 10 wt %, or about 5 wt % to about 10 wt %, based on the total weight of the binder resin. When the epoxy binder resin is included in the above ranges, a film residue ratio and chemical resistance may be greatly improved.

An epoxy equivalent weight of the epoxy binder resin may be, e.g., about 150 g/eq to about 200 g/eq. When the epoxy binder resin having an epoxy equivalent weight within the above range is included in the binder resin, there may be an advantageous effect in improving a degree of curing of the formed pattern and fixing the colorant in the structure in which the pattern is formed.

The binder resin may be dissolved in a solvent to be described below in a solid form to constitute a photosensitive resin composition. In an implementation, the binder resin in the form of solid content may be, e.g., about 0.1 wt % to about 20 wt %, or about 21 wt % to about 10 wt %, based on the total amount of the binder resin solution dissolved in the solvent.

In an implementation, the binder resin may be included in an amount of, e.g., about 1 wt % to about 20 wt %, about 3 wt % to about 15 wt %, or about 5 wt % to about 10 wt %, based on the total weight of the photosensitive resin composition. When the binder resin is included within the above ranges, excellent developability and improved crosslinking properties may be obtained during the manufacture of a color filter, thereby obtaining excellent surface smoothness.

(F) Other Additives

In an implementation, the photosensitive resin composition may further include at least one additive, e.g., malonic acid; 3-amino-1,2-propanediol; a coupling agent including a vinyl group or a (meth)acryloxy group; a leveling agent; a surfactant; or a radical polymerization initiator, in order to prevent stains or spots during the coating, to adjust leveling, or to prevent pattern residue due to non-development.

The additive may be controlled or selected depending on desired properties.

The coupling agent may include, e.g., a silane coupling agent. In an implementation, the silane coupling agent may include, e.g., trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-epoxycyclohexyl)ethyltrimethoxysilane, or the like, which may be used alone or in a mixture of two or more.

The silane coupling agent may be included in an amount of, e.g., about 0.01 parts by weight to about 1 part by weight, based on 100 parts by weight of the photosensitive resin composition.

In an implementation, the photosensitive resin composition for a color filter may further include a surfactant, e.g., a fluorine surfactant.

In an implementation, the fluorine surfactant may include, e.g., F-482, F-484, F-478, or the like made by DIC Co., Ltd.

The surfactant may be included in an amount of, e.g., about 0.01 wt % to about 5 wt %, or about 0.01 wt % to about 2 wt %, based on the total weight of the photosensitive resin composition. If the amount were to be outside of the ranges, foreign particles after development could be generated.

In an implementation, the photosensitive resin composition may include other additives, e.g., an antioxidant, a stabilizer, or the like, in a predetermined amount unless they deteriorate properties of the photosensitive resin composition.

(Photosensitive Resin Layer, Color Filter, and Display Device)

According to an embodiment, a color filter manufactured using the aforementioned photosensitive resin composition may be provided.

According to another embodiment, a color filter manufactured using the aforementioned photosensitive resin composition may be provided A method of manufacturing the color filter may be as follows.

The aforementioned photosensitive resin composition may be coated to form an about 0.1 μm to about 10 μm-thick photosensitive resin composition layer on a glass substrate using a suitable method, e.g., spin coating, roller coating, spray coating, or the like.

Subsequently, the substrate having the photosensitive resin composition layer thereon may be irradiated by light to form a pattern for a color filter. The irradiation may be performed by using, e.g., UV, an electron beam, or an X-ray as a radiation or light source. In an implementation, the UV may be irradiated, e.g., in a region of about 190 nm to about 450 nm or about 200 nm to about 400 nm. The irradiation may be performed by further using a photoresist mask. After performing the irradiation process in this way, the photosensitive resin composition layer exposed to the light source may be treated with a developer. Herein, a non-exposed portion of the photosensitive resin composition layer may be dissolved and may form the pattern for a color filter. These processes may be repeated as many times as the number of desired colors, obtaining a color filter having a desired pattern. In addition, when the image pattern obtained through development in the above process is cured by reheating or irradiating an actinic ray thereinto, crack resistance, solvent resistance, or the like may be improved.

According to another embodiment, a display device including the color filter may be provided.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(Preparation of Photosensitive Resin Composition)

Examples 1 to 15 [16] and Comparative Examples 1 to 4

Photosensitive resin composition was prepared to have each composition shown in Tables 1 and 2.

Specifically, a photopolymerization initiator was dissolved in a solvent and then, stirred at ambient temperature for 30 minutes, and a binder resin, a photopolymerizable compound, and an additive were added thereto and then, stirred at ambient temperature for 60 minutes. Then, a pigment dispersion as a colorant was added to the reactant and then, stirred at ambient temperature for 30 minutes. Subsequently, a product therefrom was twice filtered therefrom to remove impurities, preparing the photosensitive resin compositions.

TABLE 1

(unit: wt %)

| Component | Material | Solid content (%) | Ex. 1 | Ex. 2 | Ex. 3 | Ex. 4 | Ex. 5 |
|---|---|---|---|---|---|---|---|
| (A) Photopolymerizable compound | A-1 | 100 | 2.1 | 2.1 | 2.1 | 2.1 | 2.1 |
| (B) Photopolymerization initiator | B-1 | 100 | 0.5 | 0.5 | 0.5 | 0.5 | 0.5 |
| (C) Colorant | C-1 | 18 | 31.5 | 31.5 | 31.5 | 31.5 | 31.5 |
| | C-2 | 18 | 13.3 | 13.3 | 13.3 | 13.3 | 13.3 |
| (D) Binder resin | D-1 | 30 | 4.4 | 4.4 | 4.4 | 4.4 | 4.4 |
| (E) Solvent | E-1 | — | 39 | 39.5 | 40 | 40.5 | 41 |
| | E-2 | — | — | — | — | — | — |
| | E-3 | — | 9 | 8.5 | 8 | 7.5 | 7 |
| | E-4 | — | — | — | — | — | — |
| (F) Additive | F-1 | 10 | 0.2 | 0.2 | 0.2 | 0.2 | 0.2 |

TABLE 2

(unit: wt %)

| Component | Material | Solid content (%) | Ex. 6 | Ex. 7 | Ex. 8 | Ex. 9 | Ex. 10 |
|---|---|---|---|---|---|---|---|
| (A) Photopolymerizable compound | A-1 | 100 | 2.1 | 2.1 | 2.1 | 2.1 | 2.1 |
| (B) Photopolymerization initiator | B-1 | 100 | 0.5 | 0.5 | 0.5 | 0.5 | 0.5 |
| (C) Colorant | C-1 | 18 | 31.5 | 31.5 | 31.5 | 31.5 | 31.5 |
| | C-2 | 18 | 13.3 | 13.3 | 13.3 | 13.3 | 13.3 |
| (D) Binder resin | D-1 | 30 | 4.4 | 4.4 | 4.4 | 4.4 | 4.4 |
| (E) Solvent | E-1 | — | 29 | 29.5 | 30 | 30.5 | 31 |
| | E-2 | — | 10 | 10 | 10 | 10 | 10 |
| | E-3 | — | 9 | 8.5 | 8 | 7.5 | 7 |
| | E-4 | — | — | — | — | — | — |
| (F) Additive | F-1 | 10 | 0.2 | 0.2 | 0.2 | 0.2 | 0.2 |

TABLE 3

(unit: wt %)

| Component | Material | Solid content (%) | Ex. 11 | Ex. 12 | Ex. 13 | Ex. 14 | Ex. 15 | Ex. 16 |
|---|---|---|---|---|---|---|---|---|
| (A) Photopolymerizable compound | A-1 | 100 | 2.1 | 2.1 | 2.1 | 2.1 | 2.1 | 2.1 |

TABLE 3-continued

| | | | (unit: wt %) | | | | | |
|---|---|---|---|---|---|---|---|---|
| Component | Material | Solid content (%) | Ex. 11 | Ex. 12 | Ex. 13 | Ex. 14 | Ex. 15 | Ex. 16 |
| (B) Photopolymerization initiator | B-1 | 100 | 0.5 | 0.5 | 0.5 | 0.5 | 0.5 | 0.5 |
| (C) Colorant | C-1 | 18 | 31.5 | 31.5 | 31.5 | 31.5 | 31.5 | 31.5 |
| | C-2 | 18 | 13.3 | 13.3 | 13.3 | 13.3 | 13.3 | 13.3 |
| (D) Binder resin | D-1 | 30 | 4.4 | 4.4 | 4.4 | 4.4 | 4.4 | 4.4 |
| (E) Solvent | E-1 | — | 39 | 39.5 | 40 | 40.5 | 41 | 42 |
| | E-2 | — | — | — | — | — | — | — |
| | E-3 | — | — | — | — | — | — | — |
| | E-4 | — | 9 | 8.5 | 8 | 7.5 | 7 | 6.5 |
| (F) Additive | F-1 | 10 | 0.2 | 0.2 | 0.2 | 0.2 | 0.2 | 0.2 |

TABLE 4

| | | | (unit: wt %) | | | |
|---|---|---|---|---|---|---|
| Component | Material | Solid content (%) | Comp. Ex. 1 | Comp. Ex. 2 | Comp. Ex. 3 | Comp. Ex. 4 |
| (A) Photopolymerizable compound | A-1 | 100 | 2.1 | 2.1 | 2.1 | 2.1 |
| (B) Photopolymerization initiator | B-1 | 100 | 0.5 | 0.5 | 0.5 | 0.5 |
| (C) Colorant | C-1 | 18 | 31.5 | 31.5 | 31.5 | 31.5 |
| | C-2 | 18 | 13.3 | 13.3 | 13.3 | 13.3 |
| (D) Binder resin | D-1 | 30 | 4.4 | 4.4 | 4.4 | 4.4 |
| (E) Solvent | E-1 | — | 48 | 40 | 24 | 8 |
| | E-2 | — | — | 8 | 24 | 40 |
| | E-3 | — | — | — | — | — |
| | E-4 | — | — | — | — | — |
| (F) Additive | F-1 | 10 | 0.2 | 0.2 | 0.2 | 0.2 |

Each component used in Tables 1 to 4 is as follows.

(A) Photopolymerizable Compound (A-1) Dipentaerythritol hexaacrylate (DPHA, manufacturer: Nippon Kayaku)

(B) Photopolymerization Initiator (B-1) Oxime-based initiator (SPI-03, manufacturer: Samyang)

(C) Colorant (C-1) Phthalocyanine-based blue pigment dispersion (B15:6, manufacturer: SAKATA)

(C-2) Violet Pigment Dispersion (V23, Manufacturer: SAKATA)

(D) Binder Resin (D-1) Binder resin having an acid value of 30 to 180 KOHmg/g and a weight average molecular weight of 5000 to 20000 g/mol (RY-100, acryl resin, manufacturer: Showa Denko)

(E) Solvent (E-1) Propylene glycol monomethyl ether acetate (PG-MEA, boiling point: 146.4° C. @ 1 atm, manufacturer: Sigma Aldrich)

(E-2) n-Butyl alcohol (n-BA, boiling point: 117.7° C. @ 1 atm, manufacturer: Sigma Aldrich)

(E-3) Diethylene glycol methyl ethyl ether (MEDG, boiling point: 176° C. @ 1 atm, manufacturer: Sigma Aldrich)

(E-4) cyclohexanone (boiling point: 155.6° C. @ 1 atm, manufacturer: Sigma Aldrich)

(F) Additive (F-1) Fluorine surfactant (F-554, manufacturer: DIC (10% dilution used))

(Evaluation)

Evaluation Example 1: Evaluation of Uniformity

The photosensitive resin compositions were respectively used to prepare color filter specimens including each photosensitive resin layer formed thereof, and then, coating uniformity of the resin films was evaluated.

Specifically, the photosensitive resin compositions were respectively coated to be 0.4 μm thick on a transparent square glass substrate (bare glass) by using a spin-coater (K-Spin8, KDNS). The coated substrates were baked at 90° C. on a hot plate for 180 seconds, exposed with an output (power) of 500 mJ by using an exposer (I10C, Nikon Precision Inc.), and baked at 230° C. on the hot plate for 5 minutes, manufacturing the color filter specimens including each photosensitive resin layer.

Each specimen was measured with respect to a thickness distribution (Max-Min) therein by using ST-5000 (K-MAC) and then, measured with respect to coating uniformity. The results are shown in Table 5.

Evaluation Example 2: Evaluation of Slanting Defects

After manufacturing the color filter specimen including each photosensitive resin layer from the photosensitive resin compositions, the resin films were evaluated with respect to whether slanting defects occurred.

Specifically, the photosensitive resin compositions were respectively coated to be 0.4 μm thick by using a spin-coater (K-Spin8, KDNS) on a wafer with a lower pattern. Then, the coated wafer was baked at 90° C. on a hot plate for 180 seconds, exposed with an output (power) of 500 mJ by using an exposer (I10C, Nikon Precision Inc.), and baked at 230° C. on a hot plate for 5 minutes, manufacturing a color filter specimen including a photosensitive resin layer formed thereof.

A photograph of each of the specimens (the photosensitive resin layer) as viewed from above was taken through an optical microscope to evaluate whether slanting defects occurred, and the results were O (good), Δ (some defects), and X (poor). The results are shown in Table 5. Specifically, by observing the degree of oblique staining as strong=5>4>3>2>1=weak, when the degree of oblique staining was 1, 2 to 4 was marked as Δ, and 5 was marked as X.

Evaluation Example 3: Evaluation of Area of Foreign Matters

The photosensitive resin compositions were used to manufacture a color filter specimen including each photosensitive resin layer formed thereof and then, evaluated with respect to an area of foreign matters in the resin film.

Specifically, a spin-coater (K-Spina, KDNS) was used to coat each of the photosensitive resin compositions to be 0.4 μm thick on a wafer with a lower pattern. Then, the coated wafer was baked at 90° C. for 180 seconds on a hot plate, exposed with an output (power) of 500 mJ by using an exposer (I10C, Nikon Precision Inc.), and baked at 230° C. on a hot plate for 5 minutes, manufacturing a color filter specimen including a photosensitive resin layer formed thereof.

A photograph of each of the specimens (the photosensitive resin layer) was taken as viewed from above through CDSEM (HITACHI, Ltd.) to check an area of foreign matters based on a total area (100 sq %), and the results are shown in Table 5.

without slanting defects, even when coated in a spin coating method during a process of manufacturing a color filter, and minimizing issues due to foreign matter, e.g., even when the color filter is formed into a thin film.

The photosensitive resin composition according to an embodiment may include two different types of solvents having different boiling points in a specific content ratio and even when coated in a spin coating method during a process of manufacturing a color filter, may help secure coating uniformity without slanting defects and particularly, even when the color filter is formed as a thin film. and may minimize the issues of foreign matter.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising:
   a photopolymerizable compound;
   a photopolymerization initiator;
   a colorant;
   a binder resin; and
   a solvent,

TABLE 5

|  | Uniformity (Å) | Slanting defects | Foreign matter (sq %) |
|---|---|---|---|
| Example 1 | 22 | O | 2.8 |
| Example 2 | 27 | O | 2.7 |
| Example 3 | 30 | O | 2.5 |
| Example 4 | 21 | O | 2.3 |
| Example 5 | 25 | O | 2.0 |
| Example 6 | 25 | O | 2.5 |
| Example 7 | 30 | O | 2.4 |
| Example 8 | 32 | O | 2.1 |
| Example 9 | 24 | O | 2.0 |
| Example 10 | 28 | O | 1.8 |
| Example 11 | 20 | O | 3.0 |
| Example 12 | 25 | O | 2.8 |
| Example 13 | 27 | O | 2.7 |
| Example 14 | 19 | O | 2.5 |
| Example 15 | 23 | O | 2.3 |
| Example 16 | 125 | Δ | 3.3 |
| Comparative Example 1 | 142 | Δ | 12 |
| Comparative Example 2 | 175 | O | 13 |
| Comparative Example 3 | 195 | X | 12 |
| Comparative Example 4 | 184 | X | 14 |

By way of summation and review, the coating of the color filter may be performed in a spin coating method, and uniformity of the coating could be deteriorated, or slanting defects could occur due to the influence of a lower structure thereof. The color filter for an image sensor may be formed as a thin film, and if foreign matter were to be mixed thereinto during the coating, coating defects, patterning defects, or the like could occur, deteriorating a yield of products.

One or more embodiments may provide a photosensitive resin composition capable of securing coating uniformity wherein:

the solvent includes a first solvent and a second solvent, the first solvent has a boiling point of greater than about 0° C. and less than about 150° C. at 1 atm, the second solvent has a boiling point of greater than or equal to about 150° C. at 1 atm, and the solvent includes the first solvent and the second solvent in a weight ratio of 9.35:1 to 12.62:1.

2. The photosensitive resin composition as claimed in claim 1, wherein the first solvent has a boiling point of greater than or equal to about 90° C. and less than about 150° C. at 1 atm.

3. The photosensitive resin composition as claimed in claim 2, wherein the first solvent has a boiling point of greater than or equal to about 110° C. and less than about 150° C. at 1 atm.

4. The photosensitive resin composition as claimed in claim 3, wherein the first solvent includes propylene glycol monomethyl ether acetate, n-butanol, cyclobutanone, cyclopentanone, or a combination thereof.

5. The photosensitive resin composition as claimed in claim 1, wherein the second solvent has a boiling point of greater than or equal to about 150° C. and less than or equal to about 350° C. at 1 atm.

6. The photosensitive resin composition as claimed in claim 5, wherein the second solvent has a boiling point of greater than or equal to about 160° C. and less than or equal to about 290° C. at 1 atm.

7. The photosensitive resin composition as claimed in claim 6, wherein the second solvent includes a cyclic solvent including a ketone (*—(C═O)—*) functional group, a linear solvent containing an ether (*—O—*) functional group, or a combination thereof.

8. The photosensitive resin composition as claimed in claim 7, wherein the second solvent includes cyclohexanone, cycloheptanone, N-cyclohexyl-2-pyrrolidone, diethylene glycol methyl ethyl ether (MEDG), or a combination thereof.

9. The photosensitive resin composition as claimed in claim 1, wherein the first solvent is included in the photosensitive resin composition in an amount of about 30 wt % to about 60 wt %, based on a total weight of the photosensitive resin composition.

10. The photosensitive resin composition as claimed in claim 1, wherein the second solvent is included in the photosensitive resin composition in an amount of about 1 wt % to about 20 wt %, based on a total weight of the photosensitive resin composition.

11. The photosensitive resin composition as claimed in claim 1, wherein the colorant includes a pigment.

12. The photosensitive resin composition as claimed in claim 11, wherein the pigment includes a blue pigment, a purple pigment, or a mixture thereof.

13. The photosensitive resin composition as claimed in claim 1, wherein the photosensitive resin composition includes:

about 0.1 wt % to about 20 wt % of the photopolymerizable compound;

about 0.1 wt % to about 5 wt % of the photopolymerization initiator;

about 5 wt % to about 50 wt % of the colorant; and about 0.1 wt % to about 20 wt % of the binder resin, all wt % being based on a total weight of the photosensitive resin composition.

14. The photosensitive resin composition as claimed in claim 1, further comprising malonic acid; 3-amino-1,2-propanediol; a coupling agent containing a vinyl group or a (meth)acryloxy group; a leveling agent; a fluorine surfactant; or a radical polymerization initiator.

15. A photosensitive resin layer manufactured using the photosensitive resin composition as claimed in claim 1.

16. A color filter comprising the photosensitive resin layer as claimed in claim 15.

17. A display device comprising the color filter as claimed in claim 16.

* * * * *